US009445498B2

(12) United States Patent  
Kim et al.

(10) Patent No.: US 9,445,498 B2  
(45) Date of Patent: *Sep. 13, 2016

(54) EPOXY RESIN COMPOSITION AND PRINTED CIRCUIT BOARD

(71) Applicant: LG INNOTEK CO., LTD., Seoul (KR)

(72) Inventors: Myeong Jeong Kim, Seoul (KR); Jong Heum Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/651,768

(22) PCT Filed: Dec. 6, 2013

(86) PCT No.: PCT/KR2013/011311
§ 371 (c)(1),
(2) Date: Jun. 12, 2015

(87) PCT Pub. No.: WO2014/092400
PCT Pub. Date: Jun. 19, 2014

(65) Prior Publication Data
US 2015/0319854 A1 Nov. 5, 2015

(30) Foreign Application Priority Data

Dec. 12, 2012 (KR) .................. 10-2012-0144785

(51) Int. Cl.
H05K 1/05 (2006.01)
B32B 15/092 (2006.01)
B32B 27/20 (2006.01)
B32B 27/26 (2006.01)
B32B 27/38 (2006.01)
C08G 59/24 (2006.01)
C08G 59/50 (2006.01)
C08K 3/22 (2006.01)
C08K 3/28 (2006.01)
C08K 3/38 (2006.01)
C08L 63/00 (2006.01)
H05K 1/03 (2006.01)
C09K 5/14 (2006.01)

(52) U.S. Cl.
CPC ........... H05K 1/0373 (2013.01); C08G 59/245 (2013.01); C08G 59/504 (2013.01); C08K 3/22 (2013.01); C08K 3/38 (2013.01); C08L 63/00 (2013.01); C09K 5/14 (2013.01); H05K 1/056 (2013.01); C08K 2003/2227 (2013.01); C08K 2003/385 (2013.01); H05K 2201/0209 (2013.01)

(58) Field of Classification Search
USPC ........ 523/427, 428, 445, 457; 428/416, 418, 428/901
See application file for complete search history.

(56) References Cited

U.S. PATENT DOCUMENTS

| 4,594,291 A | 6/1986 | Bertram et al. |
| 4,847,348 A | 7/1989 | Fischer et al. |
| 2007/0232727 A1 | 10/2007 | Lin et al. |
| 2009/0105388 A1 | 4/2009 | Tanaka et al. |
| 2010/0016473 A1 | 1/2010 | Kaji et al. |
| 2010/0016498 A1* | 1/2010 | Kaji ..................... C08G 59/245 524/540 |
| 2011/0163461 A1* | 7/2011 | Nowak ................ C08G 59/226 257/793 |
| 2012/0202918 A1 | 8/2012 | Singh et al. |
| 2012/0296010 A1 | 11/2012 | Shimizu et al. |
| 2014/0015000 A1 | 1/2014 | Nishiyama et al. |
| 2015/0305152 A1* | 10/2015 | Kil .......................... C08L 63/00 174/258 |
| 2015/0319854 A1 | 11/2015 | Kim et al. |
| 2015/0319855 A1 | 11/2015 | Yoon et al. |
| 2015/0319856 A1* | 11/2015 | Yun ......................... C08K 3/38 174/258 |
| 2015/0319857 A1* | 11/2015 | Yoon ...................... C08K 3/28 174/258 |
| 2015/0334827 A1* | 11/2015 | Kim ...................... C08G 59/22 174/258 |

FOREIGN PATENT DOCUMENTS

| CN | 101198632 A | 6/2008 | |
| CN | 101466757 | 6/2009 | |
| CN | 101611069 A | 12/2009 | |
| CN | 101974208 | 2/2011 | |
| CN | 102559113 | 7/2012 | |
| CN | 102786773 A | 11/2012 | |
| JP | 06-200121 A | 7/1994 | |
| JP | 06-216484 A * | 8/1994 | ............... H05K 1/05 |
| JP | 06-334288 A * | 12/1994 | ............... H05K 1/05 |
| JP | 2001-279064 A | 10/2001 | |
| JP | 2008-277407 A * | 11/2008 | ............... H05K 3/46 |
| JP | 2011-181648 A | 9/2011 | |
| JP | 2011-181650 A | 9/2011 | |
| JP | 2011-181651 A | 9/2011 | |
| JP | 2011-181652 A | 9/2011 | |
| JP | 2012092297 | 5/2012 | |
| KR | 10-2000-0025443 A | 5/2000 | |
| KR | 10-2004-0039090 A | 5/2004 | |
| KR | 10-2007-0009604 A | 1/2007 | |
| KR | 10-2010-0008771 A | 1/2010 | |

(Continued)

OTHER PUBLICATIONS

Machine translation of JP 06-334288 A, provided by the JPO website (no date).*

(Continued)

Primary Examiner — Michael J Feely
(74) Attorney, Agent, or Firm — KED & Associates, LLP

(57) ABSTRACT

The epoxy resin composition according to one embodiment of the present invention contains an epoxy compound, a curing agent, and an inorganic filler, wherein the inorganic filler contains alumina ($Al_2O_3$) and boron nitride (BN).

17 Claims, 1 Drawing Sheet

(56) References Cited

FOREIGN PATENT DOCUMENTS

| | | |
|---|---|---|
| KR | 10-0937918 B1 | 1/2010 |
| KR | 10-0970906 B1 | 7/2010 |
| KR | 10-2010-0134313 A | 12/2010 |
| KR | 10-2011-0017853 A | 2/2011 |
| KR | 10-2011-0027807 A | 3/2011 |
| KR | 10-2012-0074109 A | 7/2012 |
| KR | 10-2012-0109266 A | 10/2012 |
| WO | WO 2009/138301 A1 | 11/2009 |
| WO | WO 2009/144955 A1 | 12/2009 |
| WO | WO 2012/133587 | 10/2012 |
| WO | WO 2013/009114 A2 * | 1/2013 ............. C08L 63/00 |
| WO | WO 2013/032238 A2 * | 3/2013 ............. C08G 59/20 |

OTHER PUBLICATIONS

Machine translation of JP 06-216484 A, provided by the JPO website (no date).*
Machine translation of JP 2008-277407 A, provided by the JPO website (no date).*
Machine translation of JP 2011-181651 A, provided by the JPO website (no date).*
International Search Report dated Jan. 27, 2014 issued in Application No. PCT/KR2013/011311 (with English translation).
International Search Report dated Jan. 24, 2014 issued in Application No. PCT/KR2013/011313 (with English translation).
International Search Report dated Jan. 24, 2014 issued in Application No. PCT/KR2013/011314 (with English translation).
International Search Report dated Jan. 24, 2014 issued in Application No. PCT/KR2013/011315 (with English translation).
International Search Report dated Jan. 27, 2014 issued in Application No. PCT/KR2013/010688 (with English translation).
International Search Report dated Jan. 27, 2014 issued in Application No. PCT/KR2013/011312 (with English translation).
U.S. Office action dated Feb. 3, 2016 issued in co-pending U.S. Appl. No. 14/647,721.
U.S. Office action dated Mar. 29, 2016 issued in co-pending U.S. Appl. No. 14/651,771.
U.S. Office action dated Jan. 14, 2016 issued in co-pending U.S. Appl. No. 14/651,842.
U.S. Office action dated Feb. 11, 2016 issued in co-pending U.S. Appl. No. 14/651,783.
U.S. Office action dated Jan. 14, 2016 issued in co-pending U.S. Appl. No. 14/652,031.
Chinese Office Action dated May 24, 2016 issued in Application No. 201380062540.6 (with English Translation).
U.S. Notice of Allowance dated Jun. 6, 2016 issued in U.S. Appl. No. 14/647,721.
U.S. Notice of Allowance dated May 10, 2016 issued in U.S. Appl. No. 14/651,842.
U.S. Notice of Allowance dated May 11, 2016 issued in U.S. Appl. No. 14/652,031.
Chinese Office Action dated Jun. 1, 2016 issued in Application No. 201380065257.9 (with English Translation).
Chinese Office Action dated Jun. 1, 2016 issued in Application No. 201380065310.5 (with English Translation).
Chinese Office Action dated Jun. 1, 2016 issued in Application No. 201380065125.6 (with English Translation).
Chinese Office Action dated Jun. 1, 2016 issued in Application No. 201380070409.4 (with English Translation).
U.S. Notice of Allowance dated Jun. 16, 2016 issued in U.S. Appl. No. 14/651,783.
U.S. Notice of Allowance dated Jul. 13, 2016 issued in U.S. Appl. No. 14/651,771.

* cited by examiner

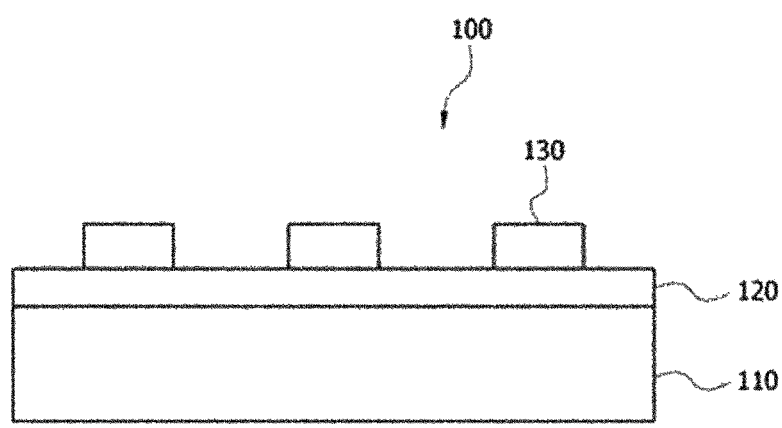

EPOXY RESIN COMPOSITION AND PRINTED CIRCUIT BOARD

CROSS-REFERENCE TO RELATED PATENT APPLICATIONS

This application is a U.S. National Stage Application under 35 U.S.C. 5371 of PCT Application No. PCT/KR2013/011311, filed Dec. 6, 2013, which claims priority to Korean Patent Application No. 10-2012-0144785, filed Dec. 12, 2012, whose entire disclosures are hereby incorporated by reference.

TECHNICAL FIELD

The present invention relates to an epoxy resin composition, and more particularly, to an epoxy resin composition and a printed circuit board including an insulating layer formed of the epoxy resin composition.

BACKGROUND ART

A printed circuit board includes a circuit pattern formed on an insulating layer, and thus a variety of electronic parts may be mounted on the printed circuit board.

For example, the electronic parts mounted on the printed circuit board may be heating elements. Heat emitted by the heating elements may degrade the performance of the printed circuit board. With the realization of high integration and higher capacity of electronic parts, there is an increasing concern about heat dissipation problems of printed circuit boards.

An epoxy resin composition including an epoxy resin of a bisphenol A type, a bisphenol F type, or the like has been used to obtain an insulating layer having electrical insulating properties and also exhibiting excellent thermal conductivity.

In addition, an epoxy resin composition including an epoxy resin represented by the following Formula is also used (Korean Unexamined Patent Application Publication No. 2010-0008771):

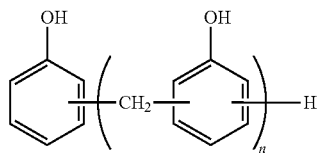

[Formula]

wherein n is an integer greater than or equal to 1.

However, such epoxy resin compositions have a problem in that it is difficult to handle heat emitted by elements due to their insufficient thermal conductivity.

DISCLOSURE

Technical Problem

To solve the above problems, one aspect of the present invention provides an epoxy resin composition and a printed circuit board.

Technical Solution

According to an aspect of the present invention, there is provided an epoxy resin composition which includes an epoxy compound represented by the following Formula 1, a curing agent, and an inorganic filler, wherein the inorganic filler includes alumina ($Al_2O_3$) and boron nitride (BN).

[Formula 1]

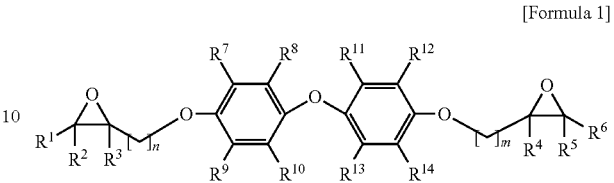

In Formula 1, $R^1$ to $R^{14}$ may each independently be selected from the group consisting of H, Cl, Br, F, a $C_1$-$C_3$ alkyl, a $C_2$-$C_3$ alkene, and a $C_2$-$C_3$ alkyne, and m and n may each be 1, 2 or 3.

The epoxy compound may include an epoxy compound represented by the following Formula 2, and the curing agent may include diaminodiphenyl sulfone.

[Formula 2]

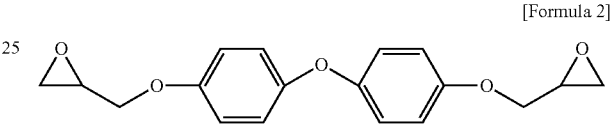

The boron nitride may include spherical boron nitride.

The boron nitride may be included at a content of 1 to 20 parts by weight, based on 100 parts by weight of the alumina.

The inorganic filler may include at least two alumina groups classified according to a particle size.

The inorganic filler may include a first alumina group having an average particle diameter of 0.3 μm to 1.0 μm, a second alumina group having an average particle diameter of 3.0 μm to 10.0 μm, and a third alumina group having an average particle diameter of 15.0 μm to 50.0 μm.

The first alumina group may be included at a content of 5 to 40 parts by weight, based on a total of 100 parts by weight of the epoxy resin composition, the second alumina group may be included at a content of 5 to 40 parts by weight, based on a total of 100 parts by weight of the epoxy resin composition, and the third alumina group may be included at a content of 30 to 80 parts by weight, based on a total of 100 parts by weight of the epoxy resin composition.

The epoxy compound of Formula 2, the curing agent and the inorganic filler may be included at contents of 3 to 40% by weight, 0.5 to 30% by weight, and 30 to 96.5% by weight, respectively, based on the total weight of the epoxy resin composition.

The epoxy resin composition may further include an amorphous epoxy compound.

A prepreg according to one exemplary embodiment of the present invention is formed by coating or impregnating a fibrous base with the epoxy resin composition according to one exemplary embodiment of the present invention.

According to another aspect of the present invention, there is provided a printed circuit board which includes a metal plate, an insulating layer formed on the metal plate, and a circuit pattern formed on the insulating layer, wherein the insulating layer is made of the epoxy resin composition according to one exemplary embodiment of the present invention.

Advantageous Effects

According to exemplary embodiments of the present invention, an epoxy resin composition can be obtained. When the epoxy resin composition is used, an insulating layer having high thermal conductivity can be obtained, and reliability and heat dissipation performance of the printed circuit board can be improved.

DESCRIPTION OF DRAWINGS

FIG. 1 is a cross-sectional view of a printed circuit board according to one exemplary embodiment of the present invention.

BEST MODE

The present invention may be modified in various forms and have various embodiments, and thus particular embodiments thereof will be illustrated in the accompanying drawings and described in the detailed description. However, it should be understood that the description set forth herein is not intended to limit the present invention, and encompasses all modifications, equivalents, and substitutions that do not depart from the spirit and scope of the present invention.

Although the terms encompassing ordinal numbers such as first, second, etc. may be used to describe various elements, these elements are not limited by these terms. These terms are only used for the purpose of distinguishing one element from another. For example, a first element could be termed a second element, and, similarly, a second element could be termed a first element without departing from the scope of the present invention. The term "and/or" includes any and all combinations of a plurality of associated listed items.

The terminology provided herein is merely used for the purpose of describing particular embodiments, and is not intended to be limiting of exemplary embodiments of the present invention. The singular forms "a," "an" and "the" are intended to include the plural forms as well, unless the context clearly indicates otherwise. It should be understood that the terms "comprises," "comprising," "includes" and/or "including," when used herein, specify the presence of stated features, integers, steps, operations, elements, components and/or combinations thereof, but do not preclude the presence or addition of one or more other features, integers, steps, operations, elements, components and/or combinations thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art, and will not be interpreted in an idealized or overly formal sense unless expressly defined otherwise herein.

It will be understood that when it is assumed that a part such as a layer, film, region, or board is disposed "on" another part, it can be directly disposed on the other part or intervening parts may also be present therebetween. On the other hand, it will be understood that when it is assumed that a part such as a layer, film, region, or board is "directly disposed on" another part, no intervening parts may be present therebetween.

Hereinafter, exemplary embodiments of the present invention will be described in detail with reference to the accompanying drawings. Regardless of reference numerals, like numbers refer to like elements throughout the description of the figures, and the description of the same elements will be not reiterated.

In this specification, the term "% by weight(s)" may be replaced with "part(s) by weight."

According to an aspect of the present invention, there is provided an epoxy resin composition which includes an epoxy resin having a mesogenic structure, a curing agent, and an inorganic filler, wherein alumina ($Al_2O_3$) and spherical boron nitride (BN) are used together as the inorganic filler. Here, mesogen is a fundamental unit of a liquid crystal, and includes a rigid structure. For example, the mesogen may include a rigid structure like biphenyl, phenyl benzoate, naphthalene, etc.

The epoxy resin composition according to one exemplary embodiment of the present invention may include the epoxy compound at a content of 3% by weight to 40% by weight, preferably 3% by weight to 30% by weight, and more preferably 3% by weight to 20% by weight, based on the total weight of the epoxy resin composition. When the epoxy compound is included at a content of 3% by weight or less based on the total weight of the epoxy resin composition, an adhesive property may be degraded. When the epoxy compound is included at a content of 40% by weight or more based on the total weight of the epoxy resin composition, it may be difficult to adjust the thickness. In this case, the epoxy resin composition may include a crystalline epoxy compound at a content of 3% by weight or more, based on the total weight of the epoxy resin composition. When the crystalline epoxy compound is included at a content of less than 3% by weight based on the total weight of the epoxy resin composition, the epoxy resin composition may not be crystallized, and thus a thermal conduction effect may be reduced.

Here, the crystalline epoxy compound may be a mesogenic compound represented by the following Formula 1.

[Formula 1]

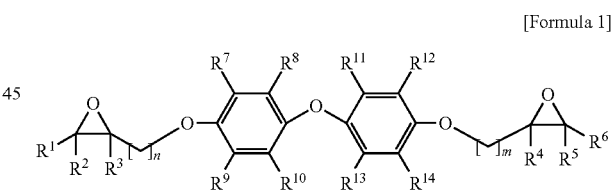

In Formula 1, $R^1$ to $R^{14}$ may each independently be selected from the group consisting of H, Cl, Br, F, a $C_1$-$C_3$ alkyl, a $C_2$-$C_3$ alkene, and a $C_2$-$C_3$ alkyne, and m and n may each be 1, 2 or 3.

The crystalline epoxy compound may be represented by the following Formula 2.

[Formula 2]

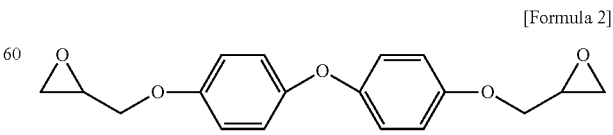

The epoxy equivalent weight of the epoxy compound (hereinafter referred to as 4,4'-biphenolether diglycidyl ether) of Formula 2 may be in a range of 120 to 300, preferably 150 to 200. For the physical properties of the epoxy compound of Formula 2, the epoxy compound had a melting point of 158° C., and the $^1$H NMR (CDCL$_3$-d6, ppm) results are as below: δ=8.58 (s, 2H), δ=8.17-8.19 (d, 4H), δ=7.99-8.01 (d, 4H), δ=7.33 (s, 4H), δ=4.69-4.72 (d, 1H), δ=4.18-4.22 (m, 1H), δ=3.36-3.40 (m, 1H), δ=2.92-2.94 (m, 1H) and δ=2.74-2.77 (m, 1H). The melting point was measured at a heating rate of 10° C./min using a differential scanning calorimetry device (DSC Q100 commercially available from TA Instruments Ltd.). The NMR measurement was performed using H-NMR after the epoxy compound is dissolved in CDCL$_3$-d6.

The epoxy compound of Formula 2 is crystalline at room temperature. The expression of crystallinity may be confirmed using the endothermic peaks of crystals in differential scanning calorimetric analysis. In this case, the endothermic peak may be shown as a plurality of peaks or broad peaks, the lowest temperature of the endothermic peak may be greater than or equal to 60° C., preferably 70° C., and the highest temperature of the endothermic peak may be less than or equal to 120° C., preferably 100° C.

Meanwhile, the epoxy compound of Formula 2 has high thermal conduction characteristics due to its high crystallinity, but may show insufficient room-temperature stability. To improve such problems, the epoxy resin composition may further include another typical amorphous epoxy compound containing two or more epoxy groups in the molecule in addition to the crystalline epoxy compound of Formula 1 or 2. The amorphous epoxy compound may be included at a content of 5% by weight to 50% by weight, preferably 10% by weight to 40% by weight, based on the total weight of the epoxy compound (the sum of weights of the crystalline epoxy compound and the amorphous epoxy compound). When the amorphous epoxy compound is included at a content of less than 5% by weight based on the total weight of the epoxy compound, the room-temperature stability may not be sufficient. On the other hand, when the amorphous epoxy compound is included at a content of greater than 50% by weight, the thermal conduction characteristics may not be sufficient.

The amorphous epoxy compound may, for example, include at least one selected from the group consisting of bisphenol A, bisphenol F, 3,3',5,5'-tetramethyl-4,4'-dihydroxydiphenyl methane, 4,4'-dihydroxydiphenyl sulfone, 4,4'-dihydroxydiphenyl sulfide, 4,4'-dihydroxydiphenyl ketone, fluorene bisphenol, 4,4'-biphenol-3,3',5,5'-tetramethyl-4,4'-dihydroxybiphenyl, 2,2'-biphenol, resorcinol, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, a divalent phenol such as allylated bisphenol A, allylated bisphenol F, or allylated phenol novolac, or a trivalent or more phenol such as phenol novolac, bisphenol A novolac, o-cresol novolac, m-cresol novolac, p-cresol novolac, xylenol novolac, poly-p-hydroxystyrene, tris-(4-hydroxyphenyl)methane, 1,1,2,2-tetrakis(4-hydroxyphenyl)ethane, phloroglucinol, pyrogallol, t-butylpyrogallol, allylated pyrogallol, polyallylated pyrogallol, 1,2,4-benzenetriol, 2,3,4-trihydroxybenzophenone, a phenol aralkyl resin, a naphthol aralkyl resin, or a dicyclopentadiene-based resin, a glycidyl-esterified compound derived from a halogenated bisphenol such tetrabromobisphenol A, and a mixture thereof.

One example of the bisphenol A type epoxy compound includes a compound represented by Formula 3.

[Formula 3]

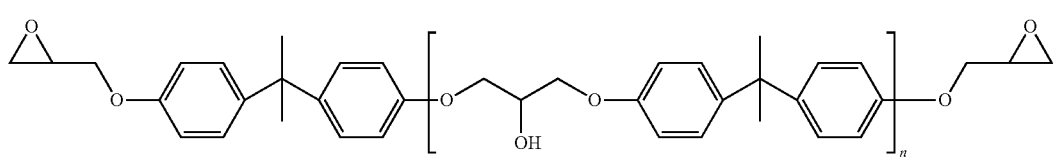

In Formula 3, n is an integer greater than or equal to 1.

One example of the bisphenol F type epoxy compound includes a compound represented by Formula 4.

[Formula 4]

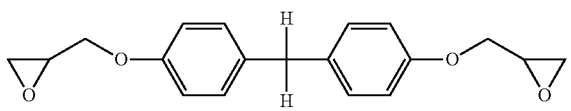

The epoxy resin composition according to one exemplary embodiment of the present invention may include the curing agent at a content of 0.5% by weight to 30% by weight, based on the total weight of the epoxy resin composition. When the curing agent is included at a content of 0.5% by weight or less based on the total weight of the epoxy resin composition, an adhesive property may be degraded. On the other hand, when curing agent is included at a content of 30% by weight or more based on the total weight of the epoxy resin composition, it may be difficult to adjust the thickness. The curing agent included in the epoxy resin composition may be 4,4'-diaminodiphenyl sulfone represented by the following Formula 5. The curing agent of Formula 5 may react with the epoxy compound of Formula 2 to improve thermal stability of the epoxy resin composition.

[Formula 5]

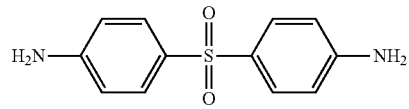

The epoxy resin composition may further include at least one selected from the group consisting of a phenolic curing agent, an amine-based curing agent, and an acid anhydride-based curing agent.

For example, the phenolic curing agent may include at least one selected from the group consisting of bisphenol A, bisphenol F, 4,4'-dihydroxydiphenyl methane, 4,4'-dihydroxydiphenyl ether, 1,4-bis(4-hydroxyphenoxy)benzene, 1,3-bis(4-hydroxyphenoxy)benzene, 4,4'-dihydroxydiphenyl sulfide, 4,4'-dihydroxydiphenyl ketone, 4,4'-dihydroxydiphenyl sulfone, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolac, bisphenol A novolac, o-cresol novolac, m-cresol novolac, p-cresol novolac, xylenol novolac, poly-p-hydroxystyrene, hydroquinone, resorcinol, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, allylated bisphenol A, allylated bisphenol F, allylated phenol novolac, allylated pyrogallol, and a mixture thereof.

For example, the amine-based curing agent may include an aliphatic amine, a polyether polyamine, an alicyclic amine, an aromatic amine, etc. The aliphatic amine may include at least one selected from the group consisting of ethylenediamine, 1,3-diaminopropane, 1,4-diaminopropane, hexamethylenediamine, 2,5-dimethylhexamethylenediamine, trimethylhexamethylenediamine, diethylenetriamine, iminobis propylamine, bis(hexamethylene)triamine, triethylenetetramine, tetraethylenepentamine, pentaethylenehexamine, N-hydroxyethyl ethylenediamine, tetra(hydroxyethyl)ethylenediamine, etc. The polyether polyamine may include at least one selected from the group consisting of triethylene glycol diamine, tetraethylene glycol diamine, diethylene glycol bis(propylamine), polyoxypropylene diamine, a polyoxypropylene triamine, and a mixture thereof. The alicyclic amine may include at least one selected from the group consisting of isophorone diamine, methacene diamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane, norbornene diamine, etc. The aromatic amine at least one selected from the group consisting of tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene, and a mixture thereof.

For example, the acid anhydride-based curing agent may include at least one selected from the group consisting of a dodecenyl succinic anhydride, a polyadipic anhydride, a polyazelaic anhydride, a polysebacic anhydride, a poly(ethyl octadecanoic diacid) anhydride, a poly(phenyl hexadecane diacid) anhydride, a methyltetrahydrophthalic anhydride, a methylhexahydrophthalic anhydride, a hexahydrophthalic anhydride, a methyl himic anhydride, a tetrahydrophthalic anhydride, a trialkyl tetrahydrophthalic anhydride, a methylcyclohexene dicarboxylic anhydride, a methylcyclohexene tetracarboxylic anhydride, a phthalic anhydride, a trimellitic anhydride, a pyromellitic anhydride, a benzophenone tetracarboxylic anhydride, ethylene glycol bistrimellitate, a chlorendic anhydride, a nadic anhydride, a methyl nadic anhydride, a 5-(2,5-dioxotetrahydro-3-furanyl)-3-methyl-3-cyclohexane-1,2-dicarboxylic anhydride, a 3,4-dicarboxy-1,2,3,4-tetrahydro-1-naphthalene succinic dianhydride, a 1-methyl-dicarboxy-1,2,3,4-tetrahydro-1-naphthalene succinic dianhydride, and a mixture thereof.

The epoxy resin composition may further include a curing accelerator.

The epoxy resin composition according to one exemplary embodiment of the present invention may include the inorganic filler at a content of 30% by weight to 96.5% by weight, based on the total weight of the epoxy resin composition. When the inorganic filler is included at a content of less than 30% by weight, high thermal conductivity, low thermal expansibility, and high-temperature thermal resistance of the epoxy resin composition may not be ensured. The high thermal conductivity, low thermal expansibility and high-temperature thermal resistance are improved as the inorganic filler is added at an increasing amount. The high thermal conductivity, low thermal expansibility and high-temperature thermal resistance are not improved according to the volume fraction of the inorganic filler, but start to be dramatically improved when the inorganic filler is added at a certain amount. However, when the inorganic filler is included at a content of greater than 96.5% by weight, formability is deteriorated due to an increase in viscosity.

The inorganic filler includes alumina ($Al_2O_3$) and boron nitride (BN).

In this case, the alumina may include at least two groups classified according to a particle size. For example, the inorganic filler may include an alumina group having an average particle diameter of 0.3 μm to 1.0 μm, an alumina group having an average particle diameter of 3.0 μm to 10.0 μm, and an alumina group having an average particle diameter of 15.0 μm to 50.0 μm. The alumina group having an average particle diameter of 0.3 μm to 1.0 μm may be included at a content of 5% by weight to 40% by weight, preferably 15% by weight to 30% by weight, based on the total weight of the epoxy resin composition. The alumina group having an average particle diameter of 3.0 μm to 10.0 μm may be included at a content of 5% by weight to 40% by weight, preferably 25% by weight to 35% by weight, based on the total weight of the epoxy resin composition. The alumina group having an average particle diameter of 15.0 μm to 50.0 μm may be included at a content of 30% by weight to 80% by weight, preferably 40% by weight to 75% by weight, based on the total weight of the epoxy resin composition. As such, when the alumina group having an average particle diameter of 0.3 μm to 1.0 μm is included at a content of 5% by weight to 40% by weight based on the total weight of the epoxy resin composition, the alumina group having an average particle diameter of 3.0 μm to 10.0 μm is included at a content of 5% by weight to 40% by weight based on the total weight of the epoxy resin composition, and the alumina group having an average particle diameter of 15.0 μm to 50.0 μm is included at a content of 30% by weight to 80% by weight based on the total weight of the epoxy resin composition, the volume ratio may be improved using the alumina having a higher particle size, and a contact path for heat transfer may be maximized by uniformly filling voids with alumina having a small or medium particle size to reduce the voids.

Also, the content of the boron nitride may be in a range of 1 part by weight to 20 parts by weight, preferably 5 parts by weight to 15 parts by weight, based on 100 parts by weight of the alumina. When the boron nitride is included at a content of less than 1 part by weight based on 100 parts by weight of the alumina, it is difficult to realize a desired level of thermal conductivity. On the other hand, when the boron nitride is included at a content of greater than 20 parts by weight based on 100 parts by weight of the alumina, formability is deteriorated due to an increase in viscosity.

In this case, the boron nitride may be spherical boron nitride. When plate-shaped boron nitride is used, the filling may be difficult due to an increase in viscosity. Therefore, it is difficult to realize a desired level of thermal conductivity when the plate-shaped boron nitride is used. The average particle diameter of the spherical boron nitride may be in a range of 5.0 μm to 30.0 μm, preferably 10.0 μm to 20.0 μm.

Further, the thermal conductivity may be maximized by further adding boron nitride having excellent thermal conduction performance, particularly spherical boron nitride.

Meanwhile, the epoxy resin composition according to one exemplary embodiment of the present invention may further include an additive at a content of 0.1% by weight to 2% by weight, preferably 0.5% by weight to 1.5% by weight, based on the total weight of the epoxy resin composition. For example, the additive may be phenoxy. When the additive is added at a content of less than 0.1% by weight, it is difficult to realize desired properties (for example, adhesivity). On the other hand, when the additive is added at a content of greater than 2% by weight, formability is deteriorated due to an increase in viscosity.

A prepreg may be prepared by coating or impregnating a fiber base or a glass base with the epoxy resin composition according to one exemplary embodiment of the present invention and semi-curing the epoxy resin composition by heating.

The epoxy resin composition according to one exemplary embodiment of the present invention may be applied to printed circuit boards. FIG. 1 is a cross-sectional view of a printed circuit board according to one exemplary embodiment of the present invention.

Referring to FIG. 1, the printed circuit board 100 includes a metal plate 110, an insulating layer 120, and a circuit pattern 130.

The metal plate 110 may be made of at least one selected from the group consisting of copper, aluminum, nickel, gold, platinum, and an alloy thereof.

The insulating layer 120 made of the epoxy resin composition according to one exemplary embodiment of the present invention is formed on the metal plate 110.

The circuit pattern 130 is formed on the insulating layer 120.

When the epoxy resin composition according to one exemplary embodiment of the present invention is used for the insulating layer, the printed circuit board having excellent heat dissipation performance may be obtained.

Hereinafter, the present invention will be described in further detail in conjunction with Examples and Comparative Examples.

Example 1

A solution obtained by mixing 9.8% by weight of the crystalline epoxy compound of Formula 2, 3.2% by weight of 4,4'-diaminodiphenyl sulfone, 1% by weight of phenoxy, 40% by weight of alumina having an average particle diameter of 15.0 μm to 50.0 μm, 24% by weight of alumina having an average particle diameter of 3.0 μm to 10.0 μm, 16% by weight of alumina having an average particle diameter of 0.3 μm to 1.0 μm, and 6% by weight of spherical boron nitride was dried, and then cured at 180° C. for 90 minutes at a load of 40 kgf/cm² to obtain an epoxy resin composition of Example 1.

Example 2

A solution obtained by mixing 6.1% by weight of the crystalline epoxy compound of Formula 2, 4.5% by weight of a bisphenol A type (YD011; Kukdo Chemical Co., Ltd.) epoxy compound, 3.4% by weight of 4,4'-diaminodiphenyl sulfone, 1% by weight of phenoxy, 40% by weight of alumina having an average particle diameter of 15.0 μm to 50.0 μm, 24% by weight of alumina having an average particle diameter of 3.0 μm to 10.0 μm, 16% by weight of alumina having an average particle diameter of 0.3 μm to 1.0 μm, and 5% by weight of spherical boron nitride was dried, and then cured at 180° C. for 90 minutes at a load of 40 kgf/cm² to obtain an epoxy resin composition of Example 2.

Example 3

A solution obtained by mixing 14.3% by weight of crystalline epoxy compound of Formula 2, 4.7% by weight of 4,4'-diaminodiphenyl sulfone, 1% by weight of phenoxy, 64% by weight of alumina having an average particle diameter of 15.0 μm to 50.0 μm, and 16% by weight of plate-shaped boron nitride was dried, and then cured at 180° C. for 90 minutes at a load of 40 kgf/cm² to obtain an epoxy resin composition of Example 3.

Example 4

A solution obtained by mixing 10.6% by weight of the crystalline epoxy compound of Formula 2, 3.4% by weight of 4,4'-diaminodiphenyl sulfone, 1% by weight of phenoxy, 36% by weight of alumina having an average particle diameter of 15.0 μm to 50.0 μm, 21% by weight of alumina having an average particle diameter of 3.0 μm to 10.0 μm, 14% by weight of alumina having an average particle diameter of 0.3 μm to 1.0 μm, and 14% by weight of plate-shaped boron nitride was dried, and then cured at 180° C. for 90 minutes at a load of 40 kgf/cm² to obtain an epoxy resin composition of Example 4.

Comparative Example 1

A solution obtained by mixing 6.0% by weight of the crystalline epoxy compound of Formula 2, 2.0% by weight of 4,4'-diaminodiphenyl sulfone, 1% by weight of phenoxy, 63% by weight of alumina having an average particle diameter of 15.0 μm to 50.0 μm, 14% by weight of alumina having an average particle diameter of 3.0 μm to 10.0 μm, and 14% by weight of alumina having an average particle diameter of 0.3 μm to 1.0 μm was dried, and then cured at 180° C. for 90 minutes at a load of 40 kgf/cm² to obtain an epoxy resin composition of Comparative Example 1.

Comparative Example 2

A solution obtained by mixing 6.1% by weight of an epoxy compound of Formula 6, 3.8% by weight of 4,4'-dihydroxydiphenyl ether, 0.1% by weight of triphenylphosphine, and 90% by weight of alumina having an average particle diameter of 0.3 μm to 1.0 μm was dried, and then cured at 180° C. for 90 minutes at a load of 40 kgf/cm² to obtain an epoxy resin composition of Comparative Example 2.

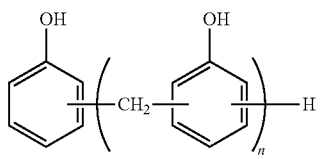

[Formula 6]

In Formula 6, n is 1.

Comparative Example 3

A solution obtained by mixing 26% by weight of a bisphenol F type (YX4000, JER) epoxy compound, 13.4% by weight of KTG-105 (Nippon Chemical Industrial Co. Ltd.), 0.6% by weight of 2E4MZ, 40% by weight of alumina having an average particle diameter of 15.0 μm to 50.0 μm, and 20% by weight of plate-shaped boron nitride was dried, and then cured at 180° C. for 90 minutes at a load of 40 kgf/cm² to obtain an epoxy resin composition of Comparative Example 3.

Comparative Example 4

A solution obtained by mixing 26% by weight of a bisphenol F type (YX4000; JER) epoxy compound, 13.4% by weight of KTG-105 (Nippon Chemical Industrial Co. Ltd.), 0.6% by weight of 2E4MZ, 50% by weight of alumina having an average particle diameter of 15.0 μm to 50.0 μm, and 10% by weight of plate-shaped boron nitride was dried, and then cured at 180° C. for 90 minutes at a load of 40 kgf/cm² to obtain an epoxy resin composition of Comparative Example 4.

Thermal conductivity of the epoxy resin compositions of Example 1 to 4 and Comparative Example 1 to 4 was measured by means of a transient hot-wire method using a thermal conductivity meter (LFA447 commercially available from Netzsch-Gerätebau GmbH.). The measured results are listed in Table 1.

TABLE 1

| Experiment No. | Thermal conductivity (W/m · K) |
| --- | --- |
| Example 1 | 12.04 |
| Example 2 | 11.50 |
| Example 3 | 8.39 |
| Example 4 | 7.81 |
| Comparative Example 1 | 7.01 |
| Comparative Example 2 | 5.3 |
| Comparative Example 3 | 1.18 |
| Comparative Example 4 | 1.14 |

As listed in Table 1, it could be seen that the epoxy resin compositions, which included the crystalline epoxy compound of Formula 2,4,4'-diaminodiphenyl sulfone, alumina and boron nitride, had a thermal conductivity of 7.8 W/m·K or more. Particularly, it could be seen that the epoxy resin compositions including alumina having various particle sizes and spherical boron nitride as in Examples 1 and 2 had a thermal conductivity of 11 W/m·K or more.

On the other hand, it could be seed that the epoxy resin composition, which included the crystalline epoxy compound of Formula 2,4,4'-diaminodiphenyl sulfone, and alumina but no boron nitride as in Comparative Example 1, had a relatively lower thermal conductivity of 7.01 W/m·K. Also, it could be seed that the epoxy resin compositions, which included alumina and boron nitride, but included the epoxy compound rather than the crystalline epoxy compound of Formula 2, and the curing agent rather than 4,4'-diaminodiphenyl sulfone as in Comparative Examples 3 and 4, had very low thermal conductivity.

Although the preferred embodiments of the present invention have been shown and described in detail, it would be appreciated by those skilled in the art that modifications and changes may be made in these embodiments without departing from the scope of the invention, the scope of which is defined in the claims and their equivalents.

The invention claimed is:

1. An epoxy resin composition comprising:
an epoxy compound represented by the following Formula 1;
a curing agent comprising diaminodiphenyl sulfone; and
an inorganic filler,
wherein the inorganic filler comprises alumina ($Al_2O_3$) and boron nitride (BN):

[Formula 1]

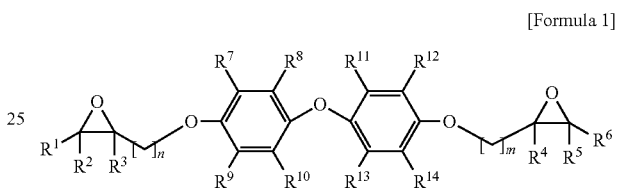

wherein each of $R^1$ to $R^{14}$ is selected from the group consisting of H, Cl, Br, F, a $C_1$-$C_3$ alkyl, a $C_2$-$C_3$ alkene, and a $C_2$-$C_3$ alkyne, and
each of m and n is 1, 2 or 3,
wherein the boron nitride is included at a content of 1 to 20 parts by weight, based on 100 parts by weight of the alumina.

2. The epoxy resin composition of claim 1, wherein the epoxy compound comprises an epoxy compound represented by the following Formula 2:

[Formula 2]

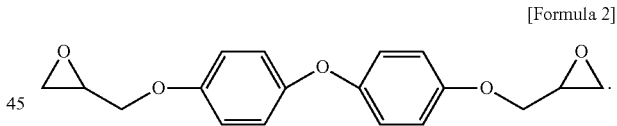

3. The epoxy resin composition of claim 1, wherein each of m and n is 2 or 3.

4. The epoxy resin composition of claim 3, wherein each of m and n is 3.

5. The epoxy resin composition of claim 1, wherein the boron nitride comprises spherical boron nitride.

6. The epoxy resin composition of claim 1, wherein the inorganic filler comprises at least two alumina groups classified according to a particle size.

7. The epoxy resin composition of claim 6, wherein the inorganic filler comprises a first alumina group having an average particle diameter of 0.3 μm to 1.0 μm, a second alumina group having an average particle diameter of 3.0 μm to 10.0 μm, and a third alumina group having an average particle diameter of 15.0 μm to 50.0 μm.

8. The epoxy resin composition of claim 7, wherein the first alumina group is included at a content of 5% to 40% by weight, based on a total weight of the epoxy resin composition, the second alumina group is included at a content of 5% to 40% by weight, based on a total weight of the epoxy resin composition, and the third alumina group is included at a content of 30% to 80% by weight, based on a total weight of the epoxy resin composition.

9. The epoxy resin composition of claim 8, wherein the first alumina group is included at a content of 15% to 30% by weight, based on a total weight of the epoxy resin composition, the second alumina group is included at a content of 25% to 35% by weight, based on a total weight of the epoxy resin composition, and the third alumina group is included at a content of 40% to 75% by weight, based on a total weight of the epoxy resin composition.

10. The epoxy resin composition of claim 1, wherein the epoxy compound of Formula 1, the curing agent, and the inorganic filler are included at contents of 3 to 40% by weight, 0.5 to 30% by weight, and 30 to 96.5% by weight, respectively, based on the total weight of the epoxy resin composition.

11. The epoxy resin composition of claim 1, further comprising an amorphous epoxy compound.

12. The epoxy resin composition of claim 11, wherein the amorphous epoxy compound is bisphenol A type epoxy compound or bisphenol F type epoxy compound.

13. A printed circuit board comprising:
a metal plate;
an insulating layer formed on the metal plate; and
a circuit pattern formed on the insulating layer,
wherein the insulating layer is made of the epoxy resin composition defined in claim 1.

14. The printed circuit board of claim 13, wherein the inorganic filler comprises at least two alumina groups classified according to a particle size.

15. The printed circuit board of claim 14, wherein the inorganic filler comprises a first alumina group having an average particle diameter of 0.3 μm to 1.0 μm, a second alumina group having an average particle diameter of 3.0 μm to 10.0 μm, and a third alumina group having an average particle diameter of 15.0 μm to 50.0 μm.

16. The printed circuit board of claim 13, wherein each of m and n is 2 or 3.

17. The printed circuit board of claim 16, wherein each of m and n is 3.

* * * * *